US009313898B2

(12) United States Patent
Mengel et al.

(10) Patent No.: US 9,313,898 B2
(45) Date of Patent: Apr. 12, 2016

(54) LOW VISCOSITY POLYMERIC PRINTING SOLUTIONS AND ELECTRONIC COMPONENTS BEARING POLYIMIDE BASED UPON THE LOW VISCOSITY POLYMERIC PRINTING SOLUTIONS

(75) Inventors: Manfred Mengel, Bad Abbach (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 955 days.

(21) Appl. No.: 12/275,458

(22) Filed: Nov. 21, 2008

(65) Prior Publication Data

US 2010/0129552 A1    May 27, 2010

(51) Int. Cl.
*C09K 19/00* (2006.01)
*H05K 3/28* (2006.01)
*C08G 73/10* (2006.01)
*C09D 179/08* (2006.01)

(52) U.S. Cl.
CPC .............. *H05K 3/285* (2013.01); *C08G 73/105* (2013.01); *C08G 73/1039* (2013.01); *C08G 73/1042* (2013.01); *C08G 73/1064* (2013.01); *C08G 73/1071* (2013.01); *C09D 179/08* (2013.01); *H05K 2201/0154* (2013.01); *H05K 2203/013* (2013.01); *Y10T 428/1005* (2015.01); *Y10T 428/1023* (2015.01)

(58) Field of Classification Search
CPC ........... C08G 73/1007; C08G 73/1039; C08G 73/1042; C08G 73/1064; C08G 73/1071; C08G 73/105; H05K 3/285; H05K 2203/013; Y10T 428/1005; Y10T 428/1023; G02F 1/133711; G02F 1/133723; G02F 1/133874; G02F 1/133788

USPC ............. 428/1.2, 1.25, 1.26, 473.5; 349/134, 349/135; 252/299.4, 500; 528/353, 335, 528/188; 535/435; 524/592, 600, 606; 427/271, 256

See application file for complete search history.

(56) References Cited

U.S. PATENT DOCUMENTS

| 4,937,133 | A |   | 6/1990 | Watanabe et al. |
|---|---|---|---|---|
| 5,137,751 | A |   | 8/1992 | Burgess et al. |
| 5,248,760 | A |   | 9/1993 | DuBois et al. |
| 6,067,139 | A | * | 5/2000 | Bohm et al. ................... 349/123 |
| 6,120,702 | A | * | 9/2000 | Miyamoto et al. .......... 252/299.4 |
| 6,139,927 | A | * | 10/2000 | Takao et al. .................. 428/1.26 |
| 7,642,641 | B2 |   | 1/2010 | Mahler et al. |

FOREIGN PATENT DOCUMENTS

| CN |   | 1924088 | * | 7/2007 |
|---|---|---|---|---|
| DE |   | 38 37 828 | A1 | 5/1990 |
| DE |   | 689 25 490 | T2 | 9/1996 |
| DE |   | 691 33 046 | T2 | 2/2003 |
| DE | 10 2004 058 305 | B3 |   | 5/2006 |
| WO |   | 92/13024 | A1 | 8/1992 |

OTHER PUBLICATIONS

Wallach et al, "Polyimide solution properties", 1969, J. Polym. Sci., Part A-2, vol. 7, p. 1995-2004.*
Roempp Lexikon Chemie, Stichwort: Isomerie, Version Vom, May 2005.*
Roempp Lexikon Chemie, Stichwort: Isomerie, Version vom May 2005. URL: http://www.roempp.com Reattached by form PTO-892.

* cited by examiner

*Primary Examiner* — Ruiyun Zhang
(74) *Attorney, Agent, or Firm* — Dicke, Billig & Czaja, PLLC

(57) ABSTRACT

An electrical component that includes a substrate and a polymeric layer oriented in working relation with the substrate, the polymeric layer including a low molecular mass polyimide.

1 Claim, 1 Drawing Sheet

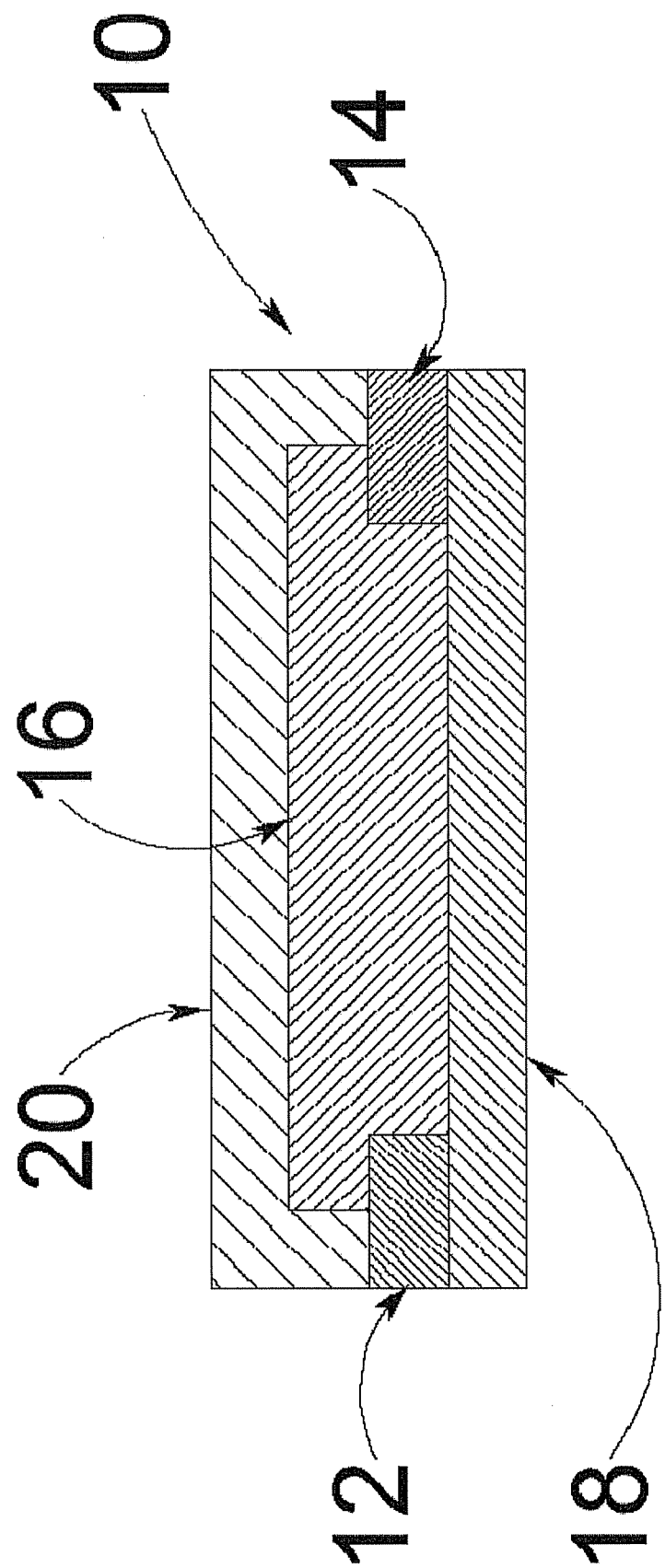

LOW VISCOSITY POLYMERIC PRINTING SOLUTIONS AND ELECTRONIC COMPONENTS BEARING POLYIMIDE BASED UPON THE LOW VISCOSITY POLYMERIC PRINTING SOLUTIONS

BACKGROUND

The present invention generally relates to polymeric printing solutions, to methods of printing polymeric printing solutions, and to articles that include one or more polyimide layers derived from the polymeric printing solution. More particularly, the present invention relates to low viscosity polymeric printing solutions, to methods of printing low viscosity polymeric printing solutions onto electronic components, and to electronic components that include one or more layers of polyimide derived from the low viscosity polymeric printing solution.

For many years, electronic components have included polymeric layers as coatings or intermediate structural films. The chemical nature of these polymeric layers and the application techniques for these polymeric layers affect the cost and properties of the electronic components. For example, the chemical nature of a particular polymeric layer may affect the thermal stability of the polymeric layer, the flexibility and durability of the polymeric layer, the ability of the polymeric layer to securely adhere to any underlying component, and the application techniques usable for the polymeric layer. Likewise, the ability to use a particular application technique for the polymeric layer may affect the application precision, the uniformity of the polymeric layer, the number of applications necessary to achieve a particular polymeric layer thickness, and the time and cost (efficiency) of polymeric layer formation.

Electronically controllable application techniques, such as ink jet application techniques, able to precisely control both application rate and location are commonly employed now when forming polymeric layers of electronic components. Such electronically controllable application techniques improve the precision and efficiency of layer formation over former techniques requiring more human labor or control.

Some types of polymeric compounds have been applied in recent years using electronically controllable application techniques. For example, some polymeric or pre-polymeric substances have been applied using electronically controllable application techniques, such as ink jet printing, to form epoxy polymer layers and acrylic polymeric layers of electronic components. Unfortunately, such epoxy and acrylic polymers are not always the most suitable choice for electronic component layers. For example, the thermal stability properties and the water absorption properties of at least some epoxy polymers and at least some acrylic polymers may not be optimum for purposes of electronic component manufacture.

High thermal stability for polymeric layers may be required during conductive material application to polymeric materials that serve an insulative function. Some epoxy polymers and some acrylic polymers that result from electronically controllable application techniques, such as ink jet printing, exhibit insufficient or less than optimum thermal stability for these conductive material applications. Also, low water absorption is desirable for electronic component manufacture to optimize operating characteristics of the electronic components. Some epoxy polymers and some acrylic polymers that result from electronically controllable application techniques, such as ink jet printing, exhibit excessive or greater than optimum water absorption characteristics for these conductive material applications.

Consequently, electronic component manufacturers have been looking beyond epoxy polymers and acrylic polymers for a polymeric material with improved thermal stability characteristics and water absorption characteristics for electronic component manufacture. Polyimide is one such polymeric material under consideration. Unfortunately, polymeric and pre-polymeric substances that yield polyimides are not entirely suitable for application via electronically controllable application techniques, such as ink jet printing. For example, the available polymeric and pre-polymeric substances that yield polyimides may be applied via electronically controllable application techniques as dilute solutions only. Due to the relatively low concentration of polyimide-yielding polymeric and pre-polymeric substances that may be using in polymeric solutions applied by electronically controllable application techniques, multiple applications are required to achieve polyimide layers of required thickness during electronic component manufacture. This unsatisfactorily diminishes the benefits of employing electronically controllable application techniques for polyimide layer formation during electronic component manufacture.

A need exists for improved polymeric substances that yield polyimides and are suitable for electronically controllable application techniques during electronic component manufacture. These polymeric substances should allow formation of polyimide layers with suitable thickness while minimizing the number of applications required by electronically controllable application techniques, such as ink jet printing, to achieve suitable polyimide layer thickness. The present invention meets these needs for improved polymeric substances that achieve suitable polyimide layer thickness with a minimum of applications by electronically controllable application techniques, such as ink jet printing.

BRIEF DESCRIPTION OF THE DRAWING

The FIGURE is a schematic view of one embodiment of an electronic component incorporating a layer of polyimide in accordance with the present invention.

SUMMARY OF THE INVENTION

The present invention includes an electrical component with a substrate and a polymeric layer oriented in working relation with the substrate, where the polymeric layer includes a low molecular mass polyimide. The present invention further includes a polymeric composition and a method.

DETAILED DESCRIPTION

In the following Detailed Description, reference is made to the accompanying drawing, which forms a part hereof, and in which is shown by way of illustration a specific embodiment in which the invention may be practiced. In this regard, directional terminology, such as "top," "bottom," "front," "back," "leading," "trailing," etc., may be used with reference to the orientation of the FIGURE being described. Because components of embodiments of the present invention may be positioned in a number of different orientations, any directional terminology is used for purposes of illustration and is in no way limiting. It is to be understood that embodiments in addition those disclosed herein may be utilized and that structural or logical changes may be made without departing from the scope of the present invention. The following detailed description, therefore, is not to be taken in a limiting sense, and the scope of the present invention is defined by the appended claims.

The present invention generally relates to polymeric printing solutions, to methods of printing polymeric printing solutions, and to articles that include one or more polyimide layers derived from the polymeric printing solution. More particularly, the present invention relates to low viscosity polymeric printing solutions, to methods of printing low viscosity polymeric printing solutions onto electronic components, and to electronic components that include one or more layers of polyimide derived from the low viscosity polymeric printing solution.

An electronic component 10, such as a semiconductor component, is generally depicted in the FIGURE. The electronic component 10 includes a first conductive element 12, a second conductive element 14, and a dielectric layer 16 oriented on a substrate 18. The electronic component 10 further includes a third conductive element 20 that electrically connects the first conductive element 12 and the second conductive element 14. The third conductive element 20 is also oriented in contact with the dielectric layer 16.

Any layer of the electronic component 10, such as the dielectric layer 16, may include or be formed of, any low molecular mass polyimide. As used herein, the term "low molecular mass polyimide" means any non-crosslinked form of an aromatic polyimide made from any "low molecular mass polyamide." As used herein, the term "low molecular mass polyamide" means an aromatic polyamide capable of forming a homogeneous polymeric solution with a viscosity (measured at 25° C.) ranging from as low as about five millipascal-seconds to as high as about forty millipascal-seconds when the solvent of the polymeric solution is N-methylpyrrolidone (NMP) and the concentration of the aromatic polyamide in the polymeric solution ranges from as low as about ten weight percent to as high as about eighty weight percent, based upon the total weight of the polymeric solution.

After application of the polymeric solution containing the low molecular mass polyamide to a substrate, such as the substrate 18 of the electronic component 10, the solvent is driven off, the remaining low molecular mass polyamide may be placed under conditions adequate to effect (1) imidization that converts the low molecular mass polyamide to low molecular mass polyimide and (2) crosslinking between adjacent molecules of low molecular mass polyimide. It is also possible and permissible for some imidization to have occurred such that some low molecular mass polyimide coexists with the low molecular mass polyamide in the polymeric solution prior to application of the polymeric solution to the substrate. Additionally, layers of the electronic component 10, such as the dielectric layer 16, may include or be made of polyimides falling outside the definition of low molecular mass polyimide, though polyimides falling within the definition of low molecular mass polyimide are typically expected to yield more of the beneficial aspects of the present invention than polyimides falling outside the definition of low molecular mass polyimide.

Various polyamides, polyimides, dianhydrides, and diamines are disclosed herein via various chemical structural formulas, such as chemical structural formulas I-XX. Though at least some of the chemical structural formulas depict a particular isomer of the polyamide, polyimide, dianhydride, or diamine that is the subject of a particular chemical structural formula, it is to be understood that each chemical structural formula present in this application is intended to represent and disclose any and all isomers of the polyamide, polyimide, dianhydride, or diamine that is the subject of a particular chemical structural formula.

Some non-exhaustive examples of polyamides usable as the low molecular mass polyamides for subsequent formation of polyimide layers of the electronic component 10 include polyamides of the following chemical structural formulas I, II, III, and IV:

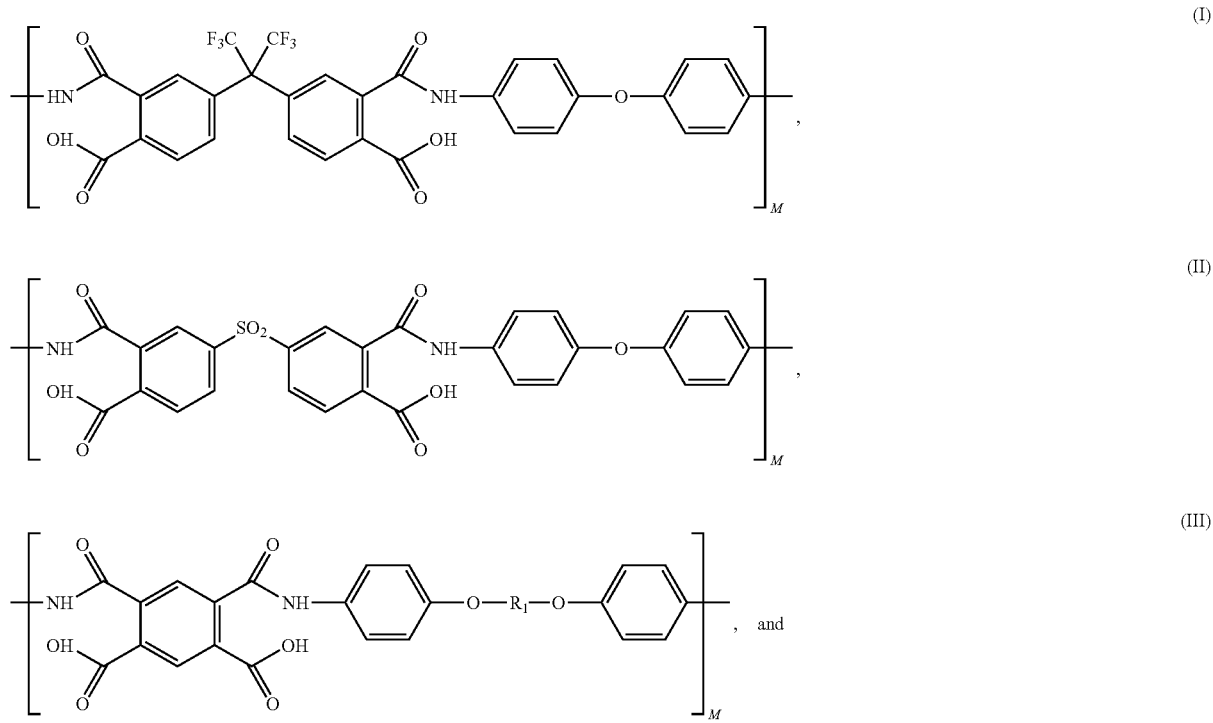

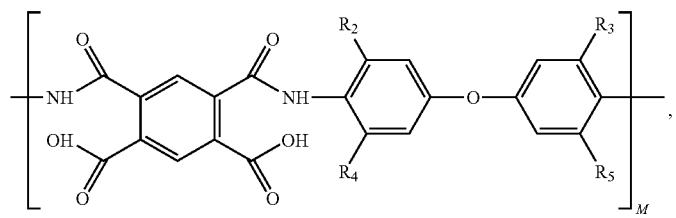

where:
- M, the polymerization degree ($P_n$), may range from as low as about 10 to as high as about 100 and in some embodiments ranges from as low as about 30 to as high as about 100,
- $R_1$ may be an alkyl group, an alkenyl group, or a carbonyl group, and
- $R_2$, $R_3$, $R_4$, and $R_5$ may be any carbonhydride of the formula $R_6 = C_n H_{2n+1}$, where n may be any integer ranging from 1 to 12 and $R_6$ may be, for example, an alkyl group or an alkenyl group. Also, $R_2$, $R_3$, $R_4$, and $R_5$ may all be the same or one or more of $R_2$, $R_3$, $R_4$, and $R_5$ may differ from the other(s) of $R_2$, $R_3$, $R_4$, and $R_5$.

The alkyl group that may serve as $R_1$ in the polyamide of chemical structural formula III may be of formula $C_n H_{2n}$, where n may be any integer ranging from 1 to 12. Thus, for example, the polyamide of chemical structural formula III may be the polyamide of chemical structural formula V:

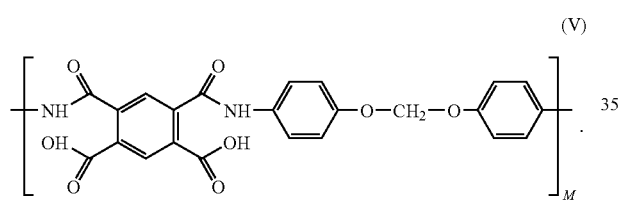

As another alternative, $R_1$ in the polyamide of chemical structural formula III may be an alkenyl group of formula $C_n H_{2n-2}$ or formula $C_n H_{2n-4}$, where n may be any integer ranging from 2 to 12. As yet another alternative, $R_1$ in the polyamide of chemical structural formula III may be an alkenyl group of formula $C_n H_{2n-6}$, where n may be any integer ranging from 3 to 12.

$R_1$ in the polyamide of chemical structural formula III may also be a carbonyl group, such as a ketone group of formula

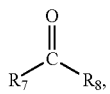

an ester group of formula $$\underset{R_9}{\overset{O}{\underset{\|}{C}}}\text{—}OR_{10},$$

an amide group of formula $$R_{11}\underset{\|}{\overset{O}{C}}\text{—}\underset{R_{12}}{N}\text{—}R_{13},$$

or an enone group of formula $$R_{14}\underset{\|}{\overset{O}{C}}\text{—}\underset{R_{15}}{\overset{R_{17}}{C}}=\underset{}{C}\text{—}R_{16}.$$

In the ketone group of formula $$R_7\underset{\|}{\overset{O}{C}}R_8,$$

$R_7$ and $R_8$ may independently be selected from (1) an alkyl group of formula $C_n H_{2n}$, where n may be any integer ranging from 1 to 12; (2) an alkenyl group of formula $C_n H_{2n-2}$ or formula $C_n H_{2n-4}$, where n may be any integer ranging from 2 to 12; and (3) an alkenyl group of formula $C_n H_{2n-6}$, where n may be any integer ranging from 3 to 12. $R_7$ and $R_8$ may be the same or different. For example, $R_7$ may be an alkyl group of formula $C_n H_{2n}$, where n may be any integer ranging from 1 to 12, and $R_8$ may be an alkenyl group of formula $C_n H_{2n-6}$, where n may be any integer ranging from 2 to 12. As one example, the polyamide of chemical structural formula III may be the polyamide of chemical structural formula VI:

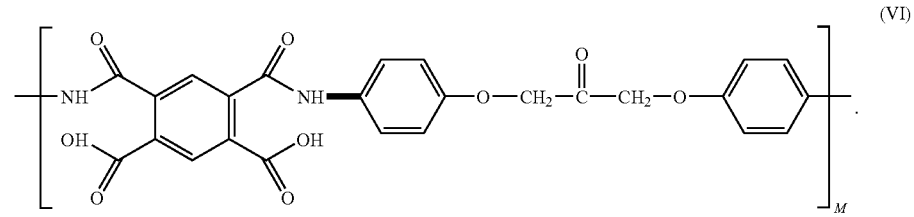

In the ester group of formula

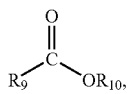

$R_9$ and $R_{10}$ may independently be selected from (1) an alkyl group of formula $C_nH_{2n}$, where n may be any integer ranging from 1 to 12; (2) an alkenyl group of formula $C_nH_{2n-2}$ or formula $C_nH_{2n-4}$, where n may be any integer ranging from 2 to 12; and (3) an alkenyl group of formula $C_nH_{2n-6}$, where n may be any integer ranging from 3 to 12. $R_9$ and $R_{10}$ may be the same or different. For example, $R_9$ may be an alkyl group of formula $C_nH_{2n}$, where n may be any integer ranging from 1 to 12, and $R_{10}$ may be an alkenyl group of formula $C_nH_{2n-4}$, where n may be any integer ranging from 2 to 12.

In the amide group of formula

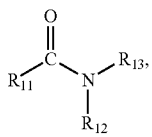

$R_{11}$, $R_{12}$, and $R_{13}$ may independently be selected from (1) an alkyl group of formula $C_nH_{2n}$, where n may be any integer ranging from 1 to 12; (2) an alkenyl group of formula $C_nH_{2n-2}$ or formula $C_nH_{2n-4}$, where n may be any integer ranging from 2 to 12; and (3) an alkenyl group of formula $C_nH_{2n-6}$, where n may be any integer ranging from 3 to 12. $R_{11}$, $R_{12}$, and $R_{13}$ may be the same or different. For example, $R_{11}$ may be an alkyl group of formula $C_nH_{2n}$, where n may be any integer ranging from 1 to 12; $R_{12}$ may be an alkenyl group of formula $C_nH_{2n-4}$, where n may be any integer ranging from 2 to 12; and $R_{13}$ may be an alkenyl group of formula $C_nH_{2n-6}$, where n may be any integer ranging from 3 to 12.

In the enone group of formula

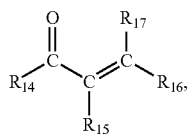

$R_{14}$, $R_{15}$, $R_{16}$ and $R_{17}$ may independently be selected from (1) an alkyl group of formula $C_nH_{2n}$, where n may be any integer ranging from 1 to 12; (2) an alkenyl group of formula $C_nH_{2n-2}$ or formula $C_nH_{2n-4}$, where n may be any integer ranging from 2 to 12; and (3) an alkenyl group of formula $C_nH_{2n-6}$, where n may be any integer ranging from 3 to 12. $R_{14}$, $R_{15}$, $R_{16}$ and $R_{17}$ may be the same or different. For example, $R_{14}$ and $R_{15}$ may be an alkyl group of formula $C_nH_{2n}$, where n may be any integer ranging from 1 to 12; $R_{16}$ may be an alkenyl group of formula $C_nH_{2n-4}$, where n may be any integer ranging from 2 to 12; and $R_{17}$ may be an alkenyl group of formula $C_nH_{2n-6}$, where n may be any integer ranging from 3 to 12.

The alkyl group that may serve as $R_6$ in the carbonhydride of formula $R_6=C_nH_{2n+1}$ that may serve as $R_2$, $R_3$, $R_4$, and/or $R_5$ in the polyamide of chemical structural formula IV may have formula $C_nH_{2n}$, where n may be any integer ranging from 1 to 12. As another alternative, $R_6$ in the carbonhydride of formula $R_6=C_nH_{2n+1}$ that may serve as $R_2$, $R_3$, $R_4$, and/or $R_5$ in the polyamide of chemical structural formula IV may be an alkenyl group of formula $C_nH_{2n-2}$ or formula $C_nH_{2n-4}$ where n may be any integer ranging from 2 to 12. As yet another alternative, $R_6$ in the carbonhydride of formula $R_6=C_nH_{2n+1}$ that may serve as $R_2$, $R_3$, $R_4$, and/or $R_5$ in the polyamide of chemical structural formula IV may be an alkenyl group of formula $C_nH_{2n-6}$, where n may be any integer ranging from 3 to 12.

The polyamides of the present invention may be produced under conventional polyamide synthesis conditions adequate to support condensation of the dianhydride component and the diamine component in a suitable organic solvent, such as N-methylpyrrolidone (NMP). The reaction conditions during formation of the polyamides are selectively controlled so the polyamides of the present invention exhibit a polymerization degree ($P_n$) ranging from as low as about 10 to as high as about 100. For example, the duration of the condensation reaction may be selectively controlled, such as by terminating the reaction earlier than typical for synthesis of longer chain polyamides, so the polyamides of the present invention exhibit a polymerization degree ($P_n$) ranging from as low as about 10 to as high as about 100.

The dianhydride used to form the polyamide of chemical structural formula I has chemical structural formula VII:

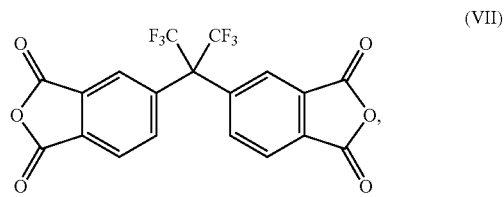

(VII)

and the diamine used to form the polyamide of chemical structural formula I has chemical structural formula VIII:

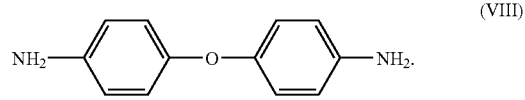 [SMILES: Nc1ccc(Oc2ccc(N)cc2)cc1]

(VIII)

The dianhydride used to form the polyamide of chemical structural formula II has chemical structural formula IX:

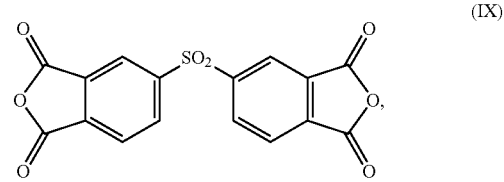

(IX)

and the diamine used to form the polyamide of chemical structural formula II has chemical structural formula VIII:

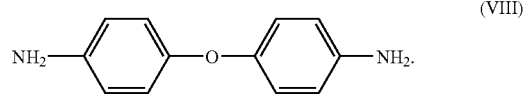

(VIII)

The dianhydride used to form the polyamide of chemical structural formula III has chemical structural formula X:

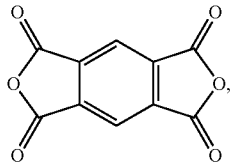
(X)

and the diamine used to form the polyamide of chemical structural formula III has chemical structural formula XI:

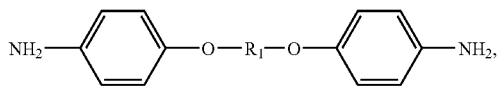
(XI)

where $R_1$ may be an alkyl group, an alkenyl group, or a carbonyl group. The alkyl group that may serve as $R_1$ in the diamine of chemical structural formula XI may be of formula $C_nH_{2n}$, where n may be any integer ranging from 1 to 12. Thus, the diamine used to form the polyamide of chemical structural formula III may have chemical structural formula XII:

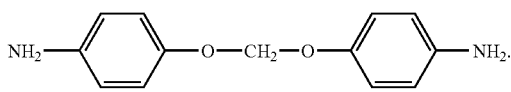
(XII)

As another alternative, $R_1$ in the diamine of chemical structural formula XI may be an alkenyl group of formula $C_nH_{2n-2}$ or formula $C_nH_{2n-4}$, where n may be any integer ranging from 2 to 12. As yet another alternative, $R_1$ in the diamine of chemical structural formula XI may be an alkenyl group of formula $C_nH_{2n-6}$, where n may be any integer ranging from 3 to 12.

$R_1$ in the diamine of chemical structural formula XI may also be a carbonyl group, such as a ketone group of formula

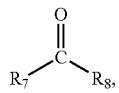

an ester group of formula

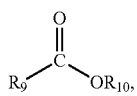

an amide group of formula

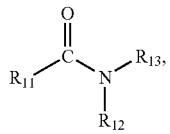

or an enone group of formula

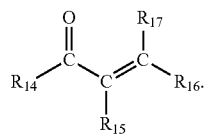

In the ketone group of formula

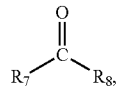

$R_7$ and $R_8$ may independently be selected from (1) an alkyl group of formula $C_nH_{2n}$, where n may be any integer ranging from 1 to 12; (2) an alkenyl group of formula $C_nH_{2n-2}$ or formula $C_nH_{2n-4}$, where n may be any integer ranging from 2 to 12; and (3) an alkenyl group of formula $C_nH_{2n-6}$, where n may be any integer ranging from 3 to 12. $R_7$ and $R_8$ may be the same or different. For example, $R_7$ may be an alkyl group of formula $C_nH_{2n}$, where n may be any integer ranging from 1 to 12, and $R_8$ may be an alkenyl group of formula $C_nH_{2n-6}$, where n may be any integer ranging from 2 to 12. Thus, as one example, the diamine used to form the polyamide of chemical structural formula III may have chemical structural formula XIII:

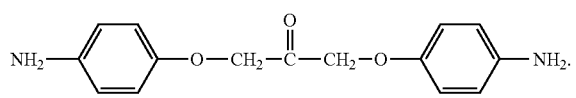
(XIII)

In the ester group of formula

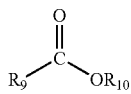

that may serve as $R_1$ in the diamine of chemical structural formula XI used to form the polyamide of chemical structural formula III, $R_9$ and $R_{10}$ may independently be selected from (1) an alkyl group of formula $C_nH_{2n}$, where n may be any integer ranging from 1 to 12; (2) an alkenyl group of formula $C_nH_{2n-2}$ or formula $C_nH_{2n-4}$, where n may be any integer ranging from 2 to 12; and (3) an alkenyl group of formula $C_nH_{2n-6}$, where n may be any integer ranging from 3 to 12. $R_9$ and $R_{10}$ may be the same or different. For example, $R_9$ may be an alkyl group of formula $C_nH_{2n}$, where n may be any integer ranging from 1 to 12, and $R_{10}$ may be an alkenyl group of formula $C_nH_{2n-4}$, where n may be any integer ranging from 2 to 12.

In the amide group of formula

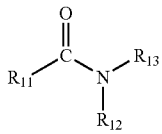

that may serve as $R_1$ in the diamine of chemical structural formula XI used to form the polyamide of chemical structural formula III, $R_{11}$, $R_{12}$, and $R_{13}$ may independently be selected from (1) an alkyl group of formula $C_nH_{2n}$, where n may be any integer ranging from 1 to 12; (2) an alkenyl group of formula $C_nH_{2n-2}$ or formula $C_nH_{2n-4}$, where n may be any integer ranging from 2 to 12; and (3) an alkenyl group of formula $C_nH_{2n-6}$, where n may be any integer ranging from 3 to 12. $R_{11}$, $R_{12}$, and $R_{13}$ may be the same or different. For example, $R_{11}$ may be an alkyl group of formula $C_nH_{2n}$, where n may be any integer ranging from 1 to 12; $R_{12}$ may be an alkenyl group of formula CnH2n-4, where n may be any integer ranging from 2 to 12; and $R_{13}$ may be an alkenyl group of formula $C_nH_{2n-6}$, where n may be any integer ranging from 3 to 12.

In the enone group of formula

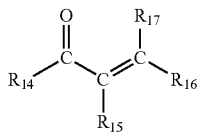

that may serve as $R_1$ in the diamine of chemical structural formula XI used to form the polyamide of chemical structural formula III, $R_{14}$, $R_{15}$, $R_{16}$ and $R_{17}$ may independently be selected from (1) an alkyl group of formula $C_nH_{2n}$, where n may be any integer ranging from 1 to 12; (2) an alkenyl group of formula $C_nH_{2n-2}$ or formula $C_nH_{2n-4}$, where n may be any integer ranging from 2 to 12; and (3) an alkenyl group of formula $C_nH_{2n-6}$, where n may be any integer ranging from 3 to 12. $R_{14}$, $R_{15}$, $R_{16}$ and $R_{17}$ may be the same or different. For example, $R_{14}$ and $R_{15}$ may be an alkyl group of formula $C_nH_{2n}$, where n may be any integer ranging from 1 to 12; $R_{16}$ may be an alkenyl group of formula $C_nH_{2n-4}$, where n may be any integer ranging from 2 to 12; and $R_{17}$ may be an alkenyl group of formula $C_nH_{2n-6}$, where n may be any integer ranging from 3 to 12.

The dianhydride used to form the polyamide of chemical structural formula IV has chemical structural formula X:

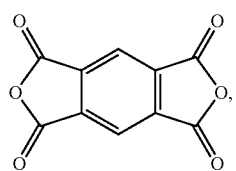

(X)

and the diamine used to form the polyamide of chemical structural formula IV has chemical structural formula XIV:

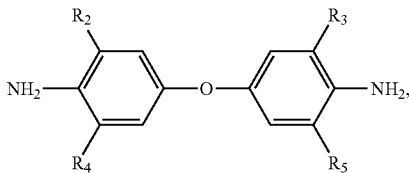

(XIV)

In the diamine of chemical structural formula XIV, $R_2$, $R_3$, $R_4$, and $R_5$ may be any carbonhydride of the formula $R_6=C_nH_{2n+1}$, where n may be any integer ranging from 1 to 12 and $R_6$ may be, for example, an alkyl group or an alkenyl group. Also, $R_2$, $R_3$, $R_4$, and $R_5$ may all be the same or one or more of $R_2$, $R_3$, $R_4$, and $R_5$ may differ from the other(s) of $R_2$, $R_3$, $R_4$, and $R_5$.

The alkyl group that may serve as $R_6$ in the carbonhydride of formula $R_6=C_nH_{2n+1}$ that may serve as $R_2$, $R_3$, $R_4$, and/or $R_5$ in the diamine of chemical structural formula XIV may have formula $C_nH_{2n}$, where n may be any integer ranging from 1 to 12. As another alternative, $R_6$ in the carbonhydride of formula $R_6=C_nH_{2n+1}$ that may serve as $R_2$, $R_3$, $R_4$, and/or $R_5$ in the diamine of chemical structural formula XIV may be an alkenyl group of formula $C_nH_{2n-2}$ or formula $C_nH_{2n-4}$ where n may be any integer ranging from 2 to 12. As yet another alternative, $R_6$ in the carbonhydride of formula $R_6=C_nH_{2n+1}$ that may serve as $R_2$, $R_3$, $R_4$, and/or $R_5$ in the diamine of chemical structural formula XIV may be an alkenyl group of formula CnH2n-6, where n may be any integer ranging from 3 to 12.

The polyamide(s) of the present invention may be homogeneously mixed with an organic solvent, such as an organic diamine solvent, to form the polymeric solution of the present invention. The polymeric solution, when printed via electronically controllable application techniques such as ink jet printing, is also sometimes referred to herein as a low viscosity polymeric printing solution. Some nonexhaustive examples of the organic solvent(s) that may used to form the polymeric solution of the present invention include acetone, cyclopentanone, tetrahydrofuran, N-methylpyrrolidone (NMP), m-cresol, and p-chlorophenol. The organic solvent(s) employed in the polymeric solution of the present invention may be included either individually, or in any combination of any of the organic solvents, in the polymeric solution.

The polyamides of the present invention may be included in the polymeric solution either individually or in any combination of any of the polyamides. Again, it is also possible and permissible for some low molecular mass polyimide(s) to coexist with the polyamide(s) in the polymeric solution. While polyimides will typically not intentionally be included in the polymeric solution, it is thought that some imidization may occur following formation of the polyamide(s) of the present invention such that some amount of the polyamide(s) included in or destined for the polymeric solution may be present as polyimide(s) in the polymeric solution.

Some non-exhaustive examples of polyimides usable as low molecular mass polyamides in various applications, such as in the dielectric layer 16 of the electronic component 10, include polyimides of the following chemical structural formulas XV, XVI, XVII, or XVIII that result following imidization of the corresponding polyamides of chemical structural formulas I, II, III, and IV, respectively:

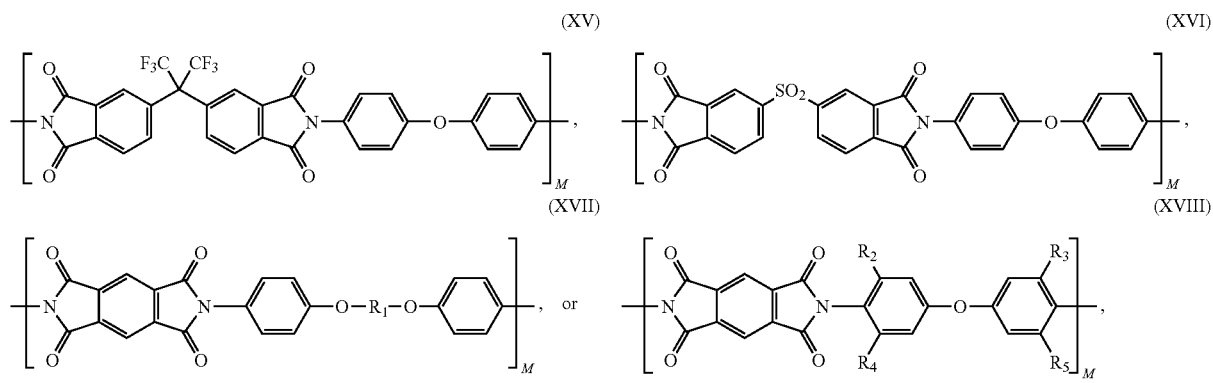

where:
- M, the polymerization degree ($P_n$), may range from as low as about 10 to as high as about 100 and in some embodiments ranges from as low as about 30 to as high as about 100,
- $R_1$ may be an alkyl group, an alkenyl group, or a carbonyl group, and
- $R_2$, $R_3$, $R_4$, and $R_5$ may be any carbonhydride of the formula $R_6=C_nH_{2n+1}$, where n may be any integer ranging from 1 to 12 and $R_6$ may be, for example, an alkyl group or an alkenyl group. Also, $R_2$, $R_3$, $R_4$, and $R_5$ may all be the same or one or more of $R_2$, $R_3$, $R_4$, and $R_5$ may differ from the other(s) of $R_2$, $R_3$, $R_4$, and $R_5$.

The alkyl group that may serve as $R_1$ in the polyimide of chemical structural formula XV may be of formula $C_nH_{2n}$, where n may be any integer ranging from 1 to 12. Thus, for example, the polyimide of chemical structural formula XV may be the polyimide of chemical structural formula XIX:

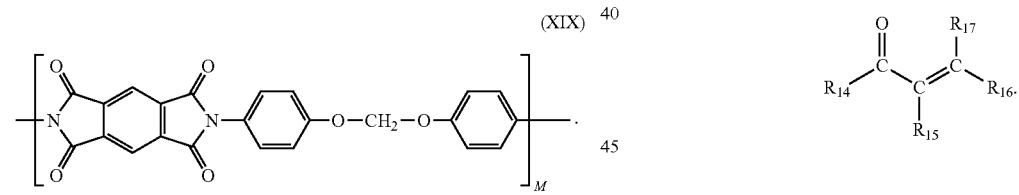

The polyimide of chemical structural formula XIX corresponds to the polyamide of chemical structural formula V.

As another alternative, $R_1$ in the polyimide of chemical structural formula XV may be an alkenyl group of formula $C_nH_{2n-2}$ or formula $C_nH_{2n-4}$, where n may be any integer ranging from 2 to 12. As yet another alternative, $R_1$ in the polyimide of chemical structural formula XV may be an alkenyl group of formula $C_nH_{2n-6}$, where n may be any integer ranging from 3 to 12.

$R_1$ in the polyimide of chemical structural formula XV may also be a carbonyl group, such as a ketone group of formula

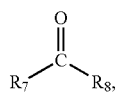

an ester group of formula

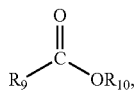

an amide group of formula

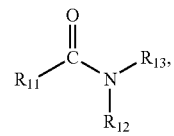

or an enone group of formula

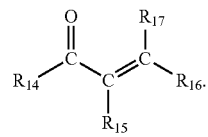

In the ketone group of formula

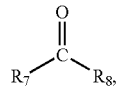

$R_7$ and $R_8$ may independently be selected from (1) an alkyl group of formula $C_nH_{2n}$, where n may be any integer ranging from 1 to 12; (2) an alkenyl group of formula $C_nH_{2n-2}$ or formula $C_nH_{2n-4}$, where n may be any integer ranging from 2 to 12; and (3) an alkenyl group of formula $C_nH_{2n-6}$, where n may be any integer ranging from 3 to 12. $R_7$ and $R_8$ may be the same or different. For example, $R_7$ may be an alkyl group of formula $C_nH_{2n}$, where n may be any integer ranging from 1 to 12, and $R_8$ may be an alkenyl group of formula $C_nH_{2n-6}$, where n may be any integer ranging from 2 to 12. As one example, the polyimide of chemical structural formula XV may be the polyimide of chemical structural formula XX:

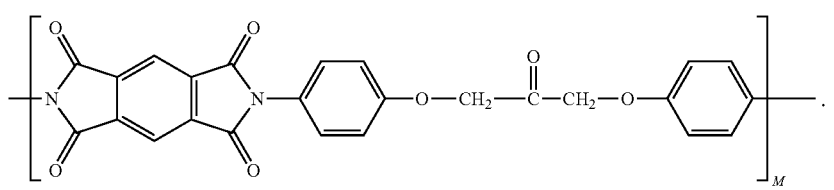

The polyimide of chemical structural formula XX corresponds to the polyamide of chemical structural formula VI.

In the ester group of formula

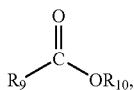

$R_9$ and $R_{10}$ may independently be selected from (1) an alkyl group of formula $C_nH_{2n}$, where n may be any integer ranging from 1 to 12; (2) an alkenyl group of formula $C_nH_{2n-2}$ or formula $C_nH_{2n-4}$, where n may be any integer ranging from 2 to 12; and (3) an alkenyl group of formula $C_nH_{2n-6}$, where n may be any integer ranging from 3 to 12. $R_9$ and $R_{10}$ may be the same or different. For example, $R_9$ may be an alkyl group of formula $C_nH_{2n}$, where n may be any integer ranging from 1 to 12, and $R_{10}$ may be an alkenyl group of formula $C_nH_{2n-4}$, where n may be any integer ranging from 2 to 12.

In the amide group of formula

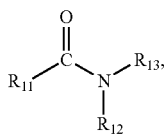

$R_{11}$, $R_{12}$, and $R_{13}$ may independently be selected from (1) an alkyl group of formula $C_nH_{2n}$, where n may be any integer ranging from 1 to 12; (2) an alkenyl group of formula $C_nH_{2n-2}$ or formula $C_nH_{2n-4}$, where n may be any integer ranging from 2 to 12; and (3) an alkenyl group of formula $C_nH_{2n-6}$, where n may be any integer ranging from 3 to 12. $R_{11}$, $R_{12}$, and $R_{13}$ may be the same or different. For example, $R_{11}$ may be an alkyl group of formula $C_nH_{2n}$, where n may be any integer ranging from 1 to 12; $R_{12}$ may be an alkenyl group of formula CnH2n-4, where n may be any integer ranging from 2 to 12; and $R_{13}$ may be an alkenyl group of formula $C_nH_{2n-6}$, where n may be any integer ranging from 3 to 12.

In the enone group of formula

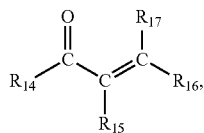

$R_{14}$, $R_{15}$, $R_{16}$ and $R_{17}$ may independently be selected from (1) an alkyl group of formula $C_nH_{2n}$, where n may be any integer ranging from 1 to 12; (2) an alkenyl group of formula $C_nH_{2n-2}$ or formula $C_nH_{2n-4}$, where n may be any integer ranging from 2 to 12; and (3) an alkenyl group of formula $C_nH_{2n-6}$, where n may be any integer ranging from 3 to 12. $R_{14}$, $R_{15}$, $R_{16}$ and $R_{17}$ may be the same or different. For example, $R_{14}$ and $R_{15}$ may be an alkyl group of formula $C_nH_{2n}$, where n may be any integer ranging from 1 to 12; $R_{16}$ may be an alkenyl group of formula $C_nH_{2n-4}$, where n may be any integer ranging from 2 to 12; and $R_{17}$ may be an alkenyl group of formula $C_nH_{2n-6}$, where n may be any integer ranging from 3 to 12.

The alkyl group that may serve as $R_6$ in the carbonhydride of formula $R_6=C_nH_{2n+1}$ that may serve as $R_2$, $R_3$, $R_4$, and/or $R_5$ in the polyimide of chemical structural formula XVII may have formula $C_nH_{2n}$, where n may be any integer ranging from 1 to 12. As another alternative, $R_6$ in the carbonhydride of formula $R_6=C_nH_{2n+1}$ that may serve as $R_2$, $R_3$, $R_4$, and/or $R_5$ in the polyimide of chemical structural formula XVII may be an alkenyl group of formula $C_nH_{2n-2}$ or formula $C_nH_{2n-4}$ where n may be any integer ranging from 2 to 12. As yet another alternative, $R_6$ in the carbonhydride of formula $R_6=C_nH_{2n+1}$ that may serve as $R_2$, $R_3$, $R_4$, and/or $R_5$ in the polyimide of chemical structural formula XVII may be an alkenyl group of formula $C_nH_{2n-6}$, where n may be any integer ranging from 3 to 12.

The collective concentration of all polyamide(s) and polyimide(s) present in the polymeric solution of the present invention may generally range from as low as about 10 weight percent to as high as about 80 weight percent, based upon the total weight of the polymeric solution. Where no or essentially no polyimide(s) are present in the polymeric solution, the collective concentration of all polyamide(s) present in the polymeric solution of the present invention may generally range from as low as about 10 weight percent to as high as about 80 weight percent, based upon the total weight of the polymeric solution.

In some embodiments, the collective concentration of all polyamide(s) and polyimide(s), or the collective concentration of all polyamide(s) when no or essentially no polyimide(s) are present, included in the polymeric solution of the present invention may range from as low as about 30 weight percent to as high as about 70 weight percent, based upon the total weight of the polymeric solution. In other embodiments, the collective concentration of all polyamide(s) and polyimide(s), or the collective concentration of all polyamide(s) when no or essentially no polyimide(s) are present, included in the polyimide solution of the present invention may range from as low as about 50 weight percent to as high as about 65 weight percent, based upon the total weight of the polymeric solution.

The polymeric solutions produced in accordance with the present invention generally may have a viscosity (measured at 25° C.) ranging from as low as about five millipascal-seconds to as high as about forty millipascal-seconds. Some embodiments of the polymeric solutions produced in accordance with the present invention have a viscosity (measured at 25° C.) ranging from as low as about ten millipascal-seconds to as high as about thirty millipascal-seconds.

Polymeric solutions of the present invention may be applied using various electronically controllable application techniques, such as ink jet application techniques, capable of precisely controlling both application rate and location over an x-y-z (three dimensional) grid. Such electronically controllable application techniques typically deposit the polymeric solution onto a surface by ejecting the polymeric solution through an orifice toward the surface without the applicator being in direct contact with the surface. Such electronically controllable application techniques also improve the precision and efficiency of layer formation over former techniques requiring more human labor or control. Exemplary ink jet application techniques may include a piezoelectric, thermal, drop-on-demand, or continuous ink jet device. Other examples of suitable electronically controllable application techniques in accordance with the present invention include aerosol jets and automated syringes, such as the MICROPEN tool, available from Ohmcraft, Inc., of Honeoye Falls, N.Y.

In one embodiment, the electronically controllable application technique utilizes an ink jet printing device that generates droplets of the inventive polymeric solution and directs the droplets toward a surface, such as a surface of the electronic component 10, where a polymeric layer is to be formed. The position of the head of the ink jet printing device may be carefully controlled and the inventive polymeric solution may be applied in highly automated fashion so discrete patterns of the inventive polymeric solution may be selectively created. Ink jet printing devices are typically capable of printing at a rate of about 1000 drops per jet per second or higher and can print linear features with good resolution at rates as low as about 10 cm/sec and as high as about 1000 cm/sec. Each drop generated by the head of ink jet printing devices typically may include from about 3 to about 100 picoliters of the inventive polymeric solution for delivery to a surface of the electronic component 10.

Ink jet printing devices typically utilize a piezoelectric mechanism system to generate droplets, although other variations are also used. For example, a thermal ink jet printing device may be used to deposit the inventive polymeric solution. In thermal ink jet printing, a print cartridge having a series of tiny electrically-heated chambers may be used. The thermal ink jet printing device runs a pulse of current through the heating elements, which causes a vapor explosion in the chamber. The explosion forms a bubble, which propels a droplet of ink onto the target substrate. When the bubble condenses, surplus polymeric solution is sucked back up from the printing surface. The surface tension of the polymeric solution causes another charge of the polymeric solution to be drawn into the chamber through a narrow channel attached to reservoir holding the polymeric solution.

The inventive polymeric solution may also be deposited by aerosol jet deposition. In aerosol jet deposition, the polymeric solution is aerosolized into droplets, and the droplets are transported to the target substrate in a flow gas through a flow channel. The flow channel is typically straight and relatively short. The polymeric solution of the present invention may also be deposited by a variety of other techniques including pen/syringe, continuous or drop on demand ink jet printing, intaglio, flexographic printing, roll printer, spraying, dip coating, spin coating, and other techniques that direct discrete units of the polymeric solution, continuous streams of the polymeric solution, or continuous sheets of the polymeric solution to the target substrate. Other exemplary printing methods for the polymeric solutions of the present invention include lithographic printing and gravure printing. Use of some of these exemplary alternatives to ink jet application may require modifications to the polymeric solution so the polymeric solution has a suitable viscosity and/or surface tension for a particular alternative to ink jet application.

The surface(s) of the electronic component 10 where the inventive polymeric solution is applied may be made of various materials. Non-limiting examples of these materials that are capable of suitably accepting the polymeric solution of the present invention include conventional polyimides, such as KAPTON™ polyimide available from DuPont de Nemours & Co of Wilmington, Del.; epoxy resin (including glass-filled epoxy resin); polycarbonate; polyester; polyethylene; polypropylene; polyvinyl chloride; ABS copolymer; metallic and ceramic surfaces; semiconductor materials, such as silicon (crystalline, amorphous, or polymerized) supported on glass, polyethylene terephthalate (PET), or polyethylene naphthalate (PEN); synthetic paper; flexible fiberboard; woven and non-woven polymeric fabric; cloth and other textiles; cellulose-based materials, such as wood or paper; metallic foil; and glass (e.g., thin glass).

Following synthesis of the polyamide of the present invention, the polyamide and any associated polyimide is solubilized in the organic solvent, such as acetone, cyclopentanone, tetrahydrofuran, N-methylpyrrolidone (NMP), m-cresol, p-chlorophenol or a mixture of these. Due to the minimized molecular mass of the inventive polyamide, the concentration of the polyamide in the polymeric solution in some embodiments of the present invention may range as high as about eighty weight percent, based upon the total weight of the polymeric solution, while maintaining the viscosity in a range suitable for delivery by conventional ink jet printing techniques and devices. While the concentration of the polyamide in the polymeric solution may range as high as about eighty weight percent, based upon the total weight of the polymeric solution, the concentration may also be lower, such as on the order of about thirty weight percent in some embodiments or even as low as about ten weight percent in other embodiments, while still achieving benefits associated with the present invention.

After formation of the polymeric composition containing the inventive polyamide, the polymeric composition may be placed in the feed tank of a conventional ink jet printing device for delivery to the surface of a substrate, such as a surface of the electronic component 10. The polymeric composition is delivered to the surface of the electronic component 10 as a nozzle or nozzles of the ink jet printing device are passed over the surface. The ink jet printing device will typically be electronically controlled and therefore capable of delivering the polymeric composition as ejected droplets of the polymeric composition in a predetermined x-y-z (three dimensional) pattern to form a film of the polymeric composition on the electronic component 10.

Beneficially, the patterned film of the polymeric composition may be formed in a just a few passes or even in just a single pass of the ink jet nozzles over the substrate while still achieving the desired amount of polymeric composition delivery in the course of forming the film of the polymeric composition on substrate, such as the electronic device 10. This ability to achieve the desired results with just a few passes or even only one pass is directly attributable to the high concentration of the polyamide usable in the polymeric composition while maintaining a viscosity sufficiently low to allow delivery of the polymeric composition via electronically controllable application technique, such as ink jet printing.

The polymeric composition, such as droplets ejected from the nozzle of the ink jet printing device, collect on the surface of the substrate, such as the electronic component 10 and form a film of the polymeric composition on the surface of the electronic component 10. The film may then be treated to remove the solvent from the deposited polymeric composition, cure the polymer, and leave a polyimide layer on the surface of the substrate, such as the electronic component 10. The treatment typically may consist of placing substrate, such as the electronic component 10, in a drying atmosphere of elevated temperature sufficient to evaporate the organic solvent of the polymeric composition. The substrate, such as the electronic component 10, is then placed in an appropriate atmosphere of elevated temperature adequate to transform the polyimide into polyamide and leave the polyimide layer in solid form.

Following solvent removal from the polymric composition, it is believed two types of reactions occur during curing of the polymer(s) present in the applied polymeric composition. More specifically, it is believed imidization and crosslinking occurs. The imidization is thought to entail transformation of amide structures into imide ring structures through cyclization of the amic acid portions of the polyamide. As an example, the imidization transforming the polyamide of structural formula III into the polyimide of structural formula XVII is believed to occur as follows:

The dielectric layer 16 need not necessarily be in the form of a wide and continuous layer. For example, the dielectric layer 16 may be applied in the form of strategically placed lines or rows of the inventive polyimide. Due to the flexibility of the electronically controllable application technique, such as ink jet printing, the lines or rows may advantageously have an average width of not greater than about 250 µm, such as not greater than about 200 µm, not greater than about 150 µm, not greater than about 100 µm, or even not greater than about 50 µm.

Following formation of the dielectric layer 16, other elements of the electronic component 10 may be applied. For example, the third conductive element 20 may be formed on the dielectric layer 16 to conductively link the first conductive element 12 and the second conductive element 14, as depicted in the FIGURE. The inventive polyimide beneficially has a high degree of thermal stability and is therefore able to withstand any heat applied to the dielectric layer 16 during formation of the third conductive element 20. Additionally, the inventive polyimide exhibits a low degree of water absorption which helps prevent degradation of the electrical characteristics of the electronic component 10.

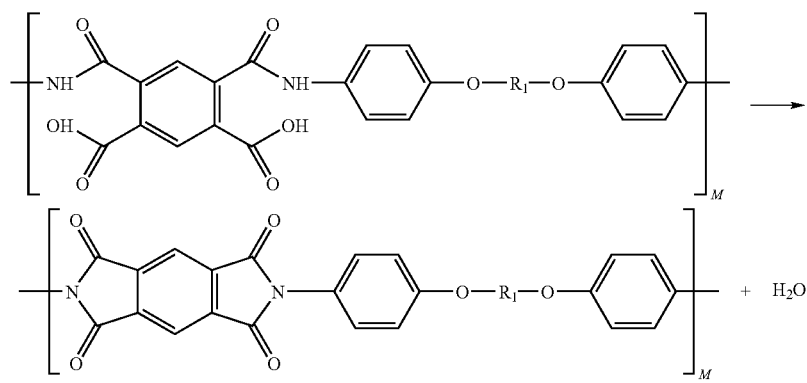

The crosslinking is thought to entail reaction of side chains of different polyimide molecules that effectively link together different polyimide molecules. While some of the crosslinking may entail crosslinking between polyamide side chains prior to imidization, which is not believed to impact imidization and polyimide formation, it is believed most crosslinking occurs between different polyimide side chains following imidization.

The dielectric constant of the inventive polyimide(s) will typically be below 2.5. Consequently, the polyimide layer of the electronic component 10 is referred to as the dielectric layer 16 of the electronic component 10 in the FIGURE. After polymer cure and polyimide formation, the dielectric layer 16 may have any desired thickness, but will typically have a thickness ranging from as low as about three micrometers up to as high as about twenty micometers, even though the film of the polymeric composition is applied during a few passes or even just one pass of the electronically controllable application technique, such as ink jet printing. In some embodiments, after curing of the polymer and polyimide formation, the dielectric layer 16 may have a thickness ranging from as low as about five micrometers ranging up to as high as about fifteen micometers. In some other embodiments, after curing of the polymer and polyimide formation, the dielectric layer 16 may have a thickness ranging from as low as about eight micrometers ranging up to as high as about twelve micometers.

The electronic component 10 has been characterized herein generally as a semiconductor element. However, the electronic features ultimately formed by applying the inventive polymeric composition using an electronically controllable application technique, such as ink jet printing, may vary widely. For example, the electronic component 10 may take the form of, or include, a passive electronic element, such as a conductor, a resistor, a dielectric, an inductor, a ferromagnetic, or a capacitor. In other aspects, the electronic component 10 may take the form of, or include, an active feature, such as a transistor, a sensor, a display device, or a memory device (e.g., a ROM device).

Characterization Procedures
1. Polymerization Degree ($P_n$)

The various polyamides and polyimides of the present invention are characterized, in part, in terms of the polymerization degree ($P_n$) of the different polymers. In general, the polymerization degree ($P_n$) of the different polyamides and polyimides may range from as low as about 10 to as high as about 100 and in some embodiments may range from as low as about 30 to as high as about 100. The polymerization degree ($P_n$) is a unitless variable. The polymerization degree ($P_n$) for the polyamides and polyimides of the present invention may be determined using gel permeation chromatography. Those of ordinary skill in the art of polyimide synthesis will reasonably be capable of determining the polymerization degree ($P_n$) for polyamides and polyimides using gel permeation chromatography.

2. Viscosity

The polymeric solutions produced in accordance with the present invention are characterized, in part, in terms of the viscosity of the polymeric solutions. The polymeric solutions produced in accordance with the present invention generally may have a viscosity (measured at 25° C.) ranging from as low as about five millipascal-seconds to as high as about forty millipascal-seconds and in some embodiments may have a viscosity (measured at 25° C.) ranging from as low as about ten millipascal-seconds to as high as about thirty millipascal-seconds.

The viscosities of polymeric solutions produced in accordance with the present invention may be determined based upon the following procedure that uses a Brookfield Model DV-111 programmable rheometer equipped with an adaptor for small samples. The Brookfield Model DV-111 rheometer is available from Brookfield Engineering Laboratories, Inc. of Stoughton, Mass. (USA).

The viscosity (the "Brookfield viscosity") of a particular sample of the polymeric solution is determined with the sample at room temperature (about 25° C.). About 5 grams of the polymeric solution being tested are placed in the small sample adaptor which is positioned within the viscosity measurement cell of the rheometer. An appropriate spindle, identified by a spindle number and selected so the measured viscosity is within the range of the particular spindle, is positioned within the small sample adaptor within the measurement cell. The Brookfield viscosity is measured while running the selected spindle at a revolution per minute (RPM) rate selected based upon calibration studies conducted in accordance with guidance available from Brookfield Engineering Laboratories for the Brookfield Model DV-111 programmable rheometer.

The invention claimed is:

1. An electrical component, the electrical component comprising:
    a substrate; and
    a polymeric layer in working relation with the substrate, the polymeric layer comprising a low molecular mass polyimide having the chemical structure of formula XXIII, or an isomer thereof:

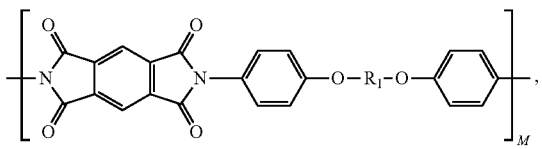

(XXIII)

wherein M is an integer ranging from as low as about 10 to as high as about 100 and:
    $R_1$ is a carbonyl group; or
    $R_1$ is an alkenyl group of formula $C_nH_{2n-2}$ and n of formula $C_nH_{2n-2}$ is an integer ranging from as low as 2 to as high as 12; or
    $R_1$ is an alkenyl group of formula $C_nH_{2n-4}$ and n of formula $C_nH_{2n-4}$ is an integer ranging from as low as 2 to as high as 12; or
    $R_1$ is an alkenyl group of formula $C_nH_{2n-6}$ and n of formula $C_nH_{2n-6}$ is an integer ranging from as low as 3 to as high as 12.

* * * * *